United States Patent
Zukavishvili et al.

(10) Patent No.: US 6,933,510 B2
(45) Date of Patent: Aug. 23, 2005

(54) RADIATION SOURCE, LITHOGRAPHIC APPARATUS, AND DEVICE MANUFACTURING METHOD

(75) Inventors: Givi Georgievitch Zukavishvili, Troitsk (RU); Vladimir Vital'Evitch Ivanov, Moscow (RU); Konstantin Nikolaevitch Koshelev, Troitsk (RU); Evgenil Dmitreevitch Korob, Troitsk (RU); Vadim Yevgenyevich Banine, Helmond (NL); Pavel Stanislavovich Antsiferov, Troitsk (RU)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/673,644

(22) Filed: Sep. 30, 2003

(65) Prior Publication Data

US 2004/0141165 A1 Jul. 22, 2004

(30) Foreign Application Priority Data

Oct. 3, 2002 (EP) .............................................. 02256907

(51) Int. Cl.$^7$ .......................... A61N 5/00; H01J 61/04; G21G 4/00
(52) U.S. Cl. ............................. 250/492.2; 250/504 R; 378/119
(58) Field of Search ............................. 355/53, 67–71; 250/492.2, 492.22, 504 R; 378/119, 143, 197

(56) References Cited

U.S. PATENT DOCUMENTS

| | | | |
|---|---|---|---|
| 3,654,567 A | 4/1972 | Hodgson | |
| 4,247,830 A | 1/1981 | Karras et al. | |
| 5,148,440 A | 9/1992 | Duncan | |
| 5,243,638 A | * 9/1993 | Wang et al. | ................. 378/119 |
| 5,499,282 A | * 3/1996 | Silfvast | ...................... 378/119 |
| 6,188,076 B1 | 2/2001 | Silfvast et al. | |
| 6,389,106 B1 | * 5/2002 | Neff et al. | ................... 378/122 |
| 6,804,327 B2 | * 10/2004 | Schriever et al. | ........... 378/119 |
| 6,815,700 B2 | * 11/2004 | Melnychuk et al. | .... 250/504 R |
| 2002/0014598 A1 | 2/2002 | Melnychuk et al. | |

FOREIGN PATENT DOCUMENTS

NL 03256180.5 12/2003

* cited by examiner

Primary Examiner—Henry Hung Nguyen
(74) Attorney, Agent, or Firm—Pillsbury Winthrop Shaw Pittman LLP

(57) ABSTRACT

A radiation source unit is provided that includes an anode and a cathode that are configured and arranged to create a discharge in a substance in a space between said anode and cathode and to form a plasma so as to generate electromagnetic radiation. The substance may comprise xenon, indium, lithium, tin or any suitable material. To improve conversion efficiency, the source unit may be constructed to have a low inductance, and operated with a minimum of plasma. To, for example, improve heat dissipation, a fluid circulation system can be created within the source volume and a wick by using a fluid in both its vapor and liquid states. To, for example, prevent contamination from entering a lithographic projection apparatus, the source unit can be constructed to minimize the production of contamination, and a trap can be employed to capture the contamination without interfering with the emitted radiation.

25 Claims, 7 Drawing Sheets

RADIATION SOURCE, LITHOGRAPHIC APPARATUS, AND DEVICE MANUFACTURING METHOD

This application claims priority from European patent application EP 02256907.3, filed Oct. 3, 2002, herein incorporated by reference in its entirety.

FIELD

The present invention relates to a radiation source unit comprising an anode and a cathode that are configured and arranged to create a discharge in a substance in a space between said anode and cathode and to form a plasma so as to generate electromagnetic radiation.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required; and a programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus the size of features that can be imaged onto the wafer is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet, also referred to as XUV or EUV, radiation. The abbreviation 'XUV' generally refers to the wavelength range from several tenths of a nanometer to several tens of nanometers, combining the soft x-ray and vacuum UV range, whereas the term 'EUV' is normally used in conjunction with lithography (EUVL) and refers to a radiation band from approximately 5 to 20 nm, i.e. part of the XUV range.

A radiation source for XUV radiation may be a discharge plasma radiation source, in which a plasma is generated by a discharge in a substance (for instance, a gas or vapor) between an anode and a cathode and in which a high temperature discharge plasma may be created by Ohmic heating by a (pulsed) current flowing through the plasma. Further, compression of a plasma due to a magnetic field generated by a current flowing through the plasma may be used to create a high temperature, high density plasma on a discharge axis (pinch effect). Stored electrical energy is directly transferred to the plasma temperature and hence to short-wavelength radiation. A pinch may allow for a plasma having a considerably higher temperature and density on the discharge axis, offering an extremely large conversion efficiency of stored electrical energy into thermal plasma energy and thus into XUV radiation. The construction and operation of plasma discharge devices, such as plasma focus, Z-pinch, hollow-cathode and capillary discharge sources, may vary, but in each of these types a magnetic field generated by the electrical current of the discharge drives the compression.

FIGS. 7A to 7E are included as an example only to provide background information about the construction and operation of such a discharge plasma radiation source. FIGS. 7A to 7E show schematically a discharge plasma radiation source of the Z-pinch hollow-cathode type. The discharge source LA has cylindrical symmetry and comprises an anode 710 and a cathode 720 connected by an electrically insulating cylindrical wall 725. An aperture 711 is provided in the anode 710 on a central axis A for passing electromagnetic radiation from the discharge source LA. The hollow cathode 720 is provided with an annular aperture 721 around the central axis A, and is further provided with a large cavity 722 behind the aperture 721. The cavity 722 also has an annular configuration around central axis A, and the walls of the cavity are a part of the cathode 720. A discharge power supply (not shown) is connected to the anode 710 and cathode 720 to provide for a pulsed voltage V across the anode-cathode gap inside the discharge source LA. Further, a suitable gas or vapor is provided by a discharge material supply (not shown) at a certain pressure p between the anode and cathode. Examples of suitable substances are xenon, lithium, tin and indium.

A discharge may take place at low initial pressure (p<0.5 Torr) and high voltage (V<10 kV) conditions, for which the electron mean free path is large compared to the dimension of the anode-cathode gap, so that Townsend ionization is ineffective. Those conditions are characterized by a large electrical field strength over gas or vapor density ratio, E/N. This stage shows rather equally spaced equipotential lines EP having a fixed potential difference, as is depicted in FIG. 7A. The ionization growth is initially dominated by events inside the hollow cathode 720 that operates at considerable lower E/N, resulting in a smaller mean free path for the electrons. Electrons e from the hollow cathode 720, and derived from the gas or vapor within the cavity 722, are injected into the anode-cathode gap, a virtual anode being created with ongoing ionization, which virtual anode propagates from the anode 710 towards the hollow cathode 720, bringing the full anode potential close to the cathode, as is shown in FIG. 7B by unevenly distributed equipotential lines EP. The electric field inside the hollow cavity 722 of the cathode 720 is now significantly enhanced.

In the next phase, the ionization continues, leading to a rapid development of a region of high-density plasma inside the hollow cathode 720, immediately behind the cathode aperture 721. Finally, injection of an intense beam of electrons e from this region into the anode-cathode gap, also shown in FIG. 7B, forms the final breakdown channel. The configuration provides for a uniform pre-ionization and breakdown in the discharge volume. FIG. 7C shows that a discharge has been initiated and low temperature plasma 735 of the gas or vapor has been created in the anode-cathode gap. An electrical current flows within the plasma from cathode 720 to anode 710, which current will induce an azimuthal magnetic field, having magnetic field strength H, within the discharge source LA. The azimuthal magnetic field causes the plasma 735 to detach from the cylindrical wall 725 and to compress, as is schematically depicted in FIG. 7C.

Dynamic compression of the plasma will take place, as further depicted in FIG. 7D, because the pressure of the azimuthal magnetic field is much larger than the thermal plasma pressure: $H^2/8\pi >> nkT$, in which n represents plasma particle density, k the Boltzmann constant and T the absolute temperature of the plasma. Electrical energy stored in a capacitor bank (part of the discharge power supply, which is not shown) connected to the anode 710 and cathode 720 will most efficiently be converted into energy of the kinetic implosion during the full time of the plasma compression. A homogeneously filled constriction (plasma pinch) 745 with a high spatial stability is created. At the final stage of plasma compression, i.e. plasma stagnation on the central, or discharge, axis A, the kinetic energy of the plasma is fully converted into thermal energy of the plasma and finally into electromagnetic radiation 740 having a very large contribution in the XUV and EUV ranges (as depicted in FIG. 7E).

When using discharge plasma sources, there is a danger that contamination originating in a radiation source such as particles, plasma and vapor, can migrate to a lithographic projection apparatus. A solution is to employ a grazing-incidence collector 880, as depicted in cross-section in FIG. 8, within a radiation source unit as the primary collection optic. The grazing-incidence collector 880 typically comprises a plurality of similarly-shaped shells 803, arranged substantially concentric about an optical axis A. Such a collector exhibits high reflectivity (approximately 70 to 100%) when the incident angle 801 of the emitted radiation 840 is kept less than approximately 10 to 20 degrees. For the sake of clarity, only two of the substantially cylindrical shells 803 are shown in FIG. 8. The shells 803 can be made from any suitable material, for instance, palladium or molybdenum, which provides a high reflection and does not react with contamination emitted by the radiation source.

FIG. 6 is included as an example of a closed heat pipe. It is used as a possible heat transfer mechanism within a radiation source, which is described below. A closed heat pipe 270 comprises a sealed container 272, a wicking surface (wick) 265 and a liquid 262 that saturates (wets) the wick 265. The sealed container 272 can be of any suitable material, for instance copper, aluminum, steel, nickel or tungsten. The choice of liquid 262 is determined by its properties (low values of liquid and vapor viscosity, high thermal conductivity, high latent heat of vaporization) and the temperature range within which the heat pipe 270 will be used. For instance, in the range 1000–2000° C., sodium, lithium or silver may be used. The wick 265 is typically made from metal foams, metal felts, ceramics, carbon fibers, a sintered powder, one or more screen meshes, grooving on the inside of the sealed container 272 or a combination of these forms.

When the heat source 205 is applied to part of the closed heat pipe 270, the liquid 262 in the wick 265 boils and forms a vapor 266. The vapor 266, which has a higher pressure than the liquid 262, moves (268) to the opposite end where it is cooled by the cooling device 275. The vapor condenses 267, giving up the latent heat of vaporization. The liquid enters the wick 265 and capillary driving force returns the liquid 262 back to the area close to the heat source 205. The use of the wick 265 makes the heat pipe 270 insensitive to gravitational effects, and thus it may be employed in any orientation. Generally, a heat pipe is used where direct cooling of an object is not feasible—the heat pipe transfers the heat to a more convenient location, where cooling can be performed.

A number of improvements are required before EUV production by gas discharge plasma can be considered suitable (production-worthy) for large-scale production of devices, for instance integrated circuits. These include:

higher conversion efficiency. Current sources typically display a conversion efficiency (ratio of power-out at required wavelength to power-in) of approximately 0.5%, resulting in the majority of the input power being converted into heat;

efficient heat removal (cooling). Two components may be distinguished—peak heat load from plasma jets during discharge and average heat load due to repeated discharge. The area over which the heat can be spread is typically limited, and heat removal becomes critical as power levels and repetition rates are increased to achieve a production-worthy source. Overheating of one or more electrode surfaces may occur, affecting pinch size and position if the geometry of the electrodes changes (deformation);

stable pulse timing and energy. For use with a lithographic projection apparatus, the source should produce a stable output during projection. This can be negatively influenced by, for instance, variations in EUV pulse timing (jitter), variations in pinch position and size, and variations in EUV pulse energy;

reduction of electrode erosion. The plasma created may erode the electrodes, since they may be present on and/or adjoining the axis on which the high-temperature, high-density plasma is created. Such erosion limits the lifetime of the electrodes and increases the amount of contamination present in the discharge space. Further, proper functioning of the electrodes for triggering the plasma is dependent on several factors, including a predetermined relationship between the geometry of the electrodes. Erosion or deformation of either electrode may influence the triggering instant of the plasma and the timing of the pulse of generated EUV radiation; and low illumination lifetime caused by contamination emission. Plasma sources emit substantial amounts of contaminant molecules, ions and other (fast) particles. If such particles and molecules are allowed to reach the illumination system, they can damage the delicate reflectors and other elements and cause build-up of absorbing layers on the surfaces of optical elements. Such damage and built-up layers cause an undesirable loss of beam intensity, reducing the throughput of the lithographic projection apparatus. In addition, such layers can be difficult to remove or repair.

Accordingly, it would be advantageous to provide a radiation source that provides an enhanced conversion efficiency of electrical energy into radiation and/or that provides production-worthy power levels and repetition rates without risk of overheating. It would also be advantageous to provide a radiation source having a stable, well-defined timing and well-defined energy of generated pulses (shots) of XUV radiation and/or that causes a minimum amount of contamination of the adjoining lithographic projection apparatus.

SUMMARY

According to an aspect of the present invention, there is provided a radiation source comprising an anode and a cathode that are configured and arranged to create a discharge in a substance in a discharge space between said anode and cathode and to form a plasma so as to generate electromagnetic radiation, wherein a wicking surface area of walls defining said discharge space is provided with a wicking function for transporting a liquid towards said discharge space from a liquid reservoir in contact with said wicking surface area. The liquid may comprise xenon, indium, lithium, tin or any suitable material. The wicking surface (wick) provides a convenient means to supply the discharge area with liquid, and the continuous presence of liquid at the discharge space improves the heat dissipation and reduces erosion of the electrodes.

In another aspect of the invention, a cooling surface area of walls defining a discharge space of a radiation source is provided with a cooling function for condensing vaporized liquid from said discharge space so as to transfer heat from said discharge space to said cooling surface. To improve heat dissipation, a fluid circulation system is created within the source volume and the wick by using a fluid in both its vapor and liquid states. This fluid may or may not be the same as the substance in which the discharge is created. Heat is transported from said discharge space to the periphery by evaporation of said fluid at said discharge space and condensation of said fluid at said periphery adjacent to a cooling element.

The said radiation source may comprise an energetic beam for irradiating said wicking surface area proximate said discharge space to provide an enhanced method of controlling the amount of vapor present in the discharge space, and to allow the source to operate with a minimum of vapor in the discharge space. This reduces the absorption of the emitted radiation, increasing the energy output and thus increasing the conversion efficiency.

In another aspect of the invention, there is provided a radiation source unit comprising: a radiation source provided with an anode and a cathode that are configured and arranged to create a discharge in a substance in a discharge space between said anode and cathode and to form a plasma so as to generate electromagnetic radiation; and a hollow receptacle arranged on an optical axis of said radiation source, an open end of said receptacle being directed to said radiation source for capturing contamination emitted from said radiation source. Said receptacle prevents contamination from entering a lithographic projection apparatus by capturing it, which may be further enhanced by cooling the receptacle.

In a further aspect, there is provided a radiation source comprising: an anode and a cathode that are configured and arranged to create a discharge in a substance in a discharge space between said anode and cathode and to form a plasma so as to generate electromagnetic radiation; an aperture being provided in at least one of said anode and cathode through which said electromagnetic radiation is emitted, wherein said aperture comprises a plurality of electrically-conductive structures arranged so as to leave said aperture substantially open to said radiation but to substantially close said aperture electrically. This reduces the inductance of the system, thus increasing the conversion energy. Additionally, the smaller electrical aperture increases the stability of the pinch position, reducing variation in the pulse-to-pulse energy.

In a still further aspect, there is provided a radiation source comprising an anode and a cathode that are configured and arranged to create a discharge in a substance in a discharge space between said anode and cathode and to form a plasma so as to generate electromagnetic radiation, wherein said radiation source comprises at least one closed heat pipe to cool the discharge space. Employing a closed heat pipe simplifies source construction, and allows smaller dimensions proximate the discharge region because the cooling element may moved to the periphery of the source LA. Smaller dimensions means less inductance and less plasma to be heated in the discharge region, both of which result in improved conversion efficiency.

According to yet a further aspect of the present invention there is provided a lithographic projection apparatus comprising: a radiation system for providing a projection beam of radiation; a support structure for supporting patterning device, the patterning device serving to pattern the projection beam according to a desired pattern; a substrate table for holding a substrate; and a projection system for projecting the patterned beam onto a target portion of the substrate, wherein said radiation system comprises a radiation source or radiation source unit as described above.

According to yet another aspect of the invention there is provided a device manufacturing method comprising the steps of: providing a substrate that is at least partially covered by a layer of radiation-sensitive material; providing a projection beam of radiation using a radiation system comprising a radiation source or radiation source unit as described above; using patterning device to endow the projection beam with a pattern in its cross-section; and projecting the patterned beam of radiation onto a target portion of the layer of radiation-sensitive material.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm).

BRIEF DESCRIPTION OF THE DRAWINGS

Embodiments of the invention will now be described, by way of example only, with reference to the accompanying schematic drawings, in which corresponding reference symbols indicate corresponding parts, and in which:

FIG. 2A shows the central portion of FIG. 2A;

FIGS. 3B and 3C depict two embodiments of cross-section B—B;

FIGS. 4B and 4C depict cross-sections C—C and D—D respectively;

FIGS. 5B and 5C depict cross-sections E—E and F—F respectively;

The skilled artisan will appreciate that the elements in the figures are illustrated for simplicity and clarity and have not necessarily been drawn to scale. For instance, the dimensions of some of the elements in the figures may be exaggerated relative to other elements to help improve the understanding of the embodiments of the present invention.

DETAILED DESCRIPTION

Figure 1:
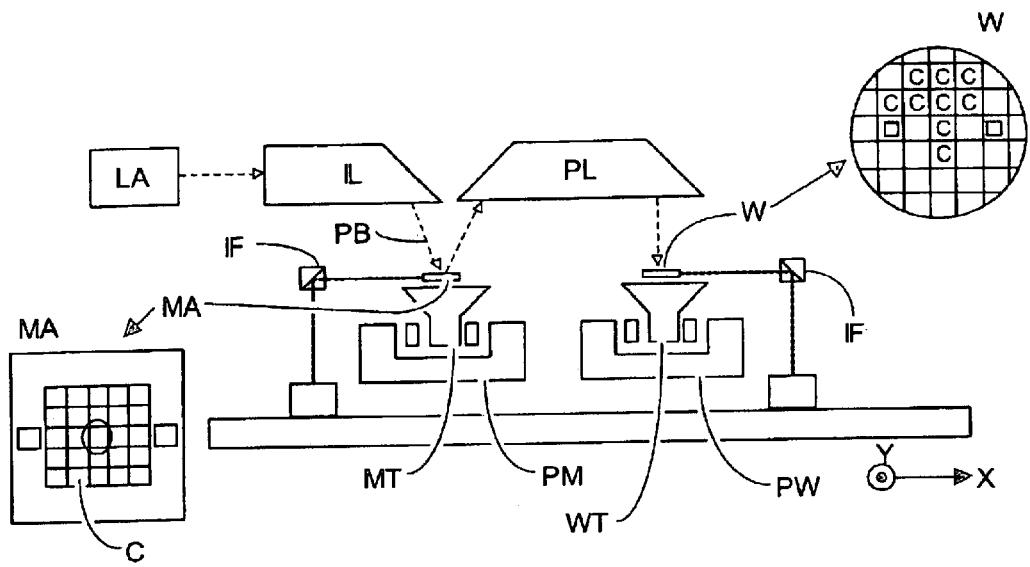
FIG. 1 depicts a lithographic projection apparatus comprising a radiation source unit according to an embodiment of the invention.

FIG. 1 schematically depicts a lithographic projection apparatus according to a particular embodiment of the invention. The apparatus comprises:

a radiation system LA, IL, for supplying a projection beam PB of radiation, for instance, EUV having a wavelength in the range 5–20 nm. In this particular case, the radiation system also comprises a radiation source LA;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a resist-coated silicon wafer), and connected to second positioning means PW for accurately positioning the substrate with respect to item PL;

a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

Referring to FIG. 1, a discharge plasma source LA typically produces a beam of radiation as a train of pulses that are synchronized with the operation of the lithographic projection apparatus. This beam is fed into an illumination system (illuminator) IL, either directly or after having traversed conditioning means, for instance a spectral filter. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus, but that it may also be remote from the lithographic projection apparatus, the radiation beam which it produces being led into the apparatus with the aid of suitable optical components, for instance, directing mirrors. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2A:
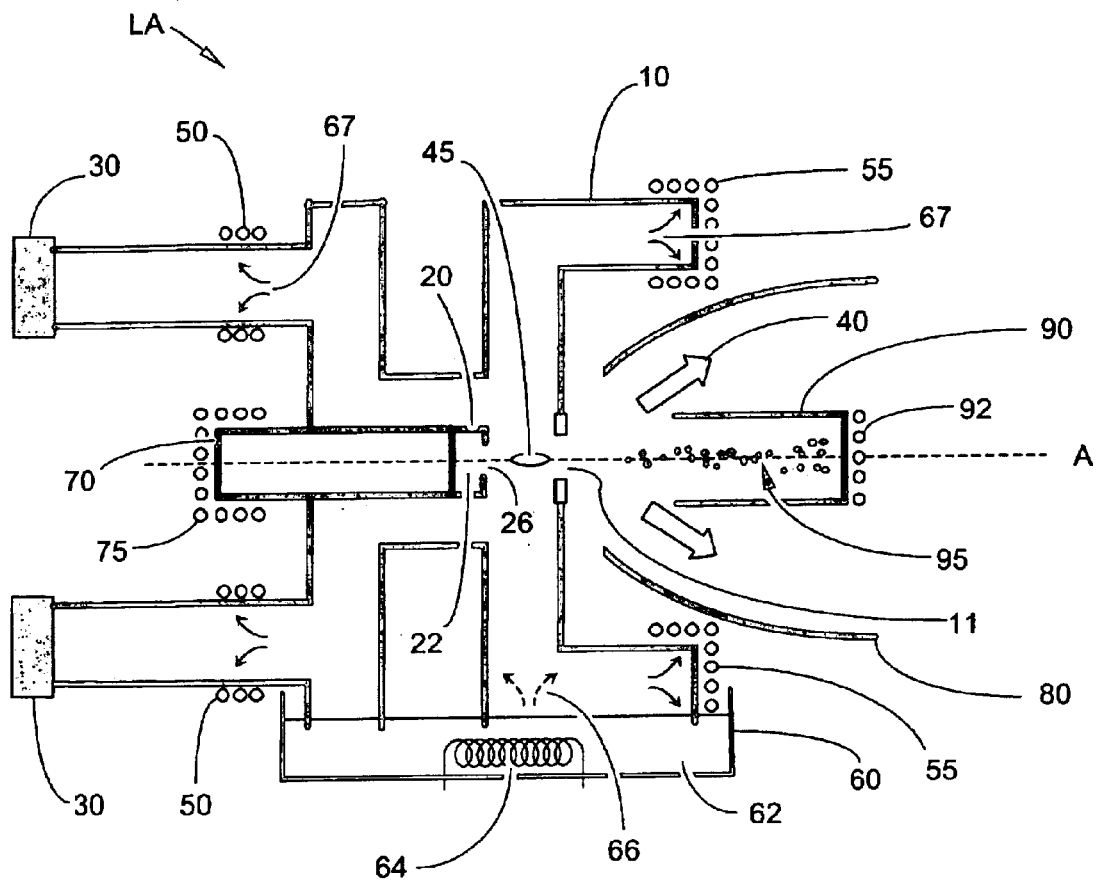
FIGS. 2A to 2B depict a radiation source unit comprising an open heat pipe construction according an embodiment of the invention, where
Figure 2B:
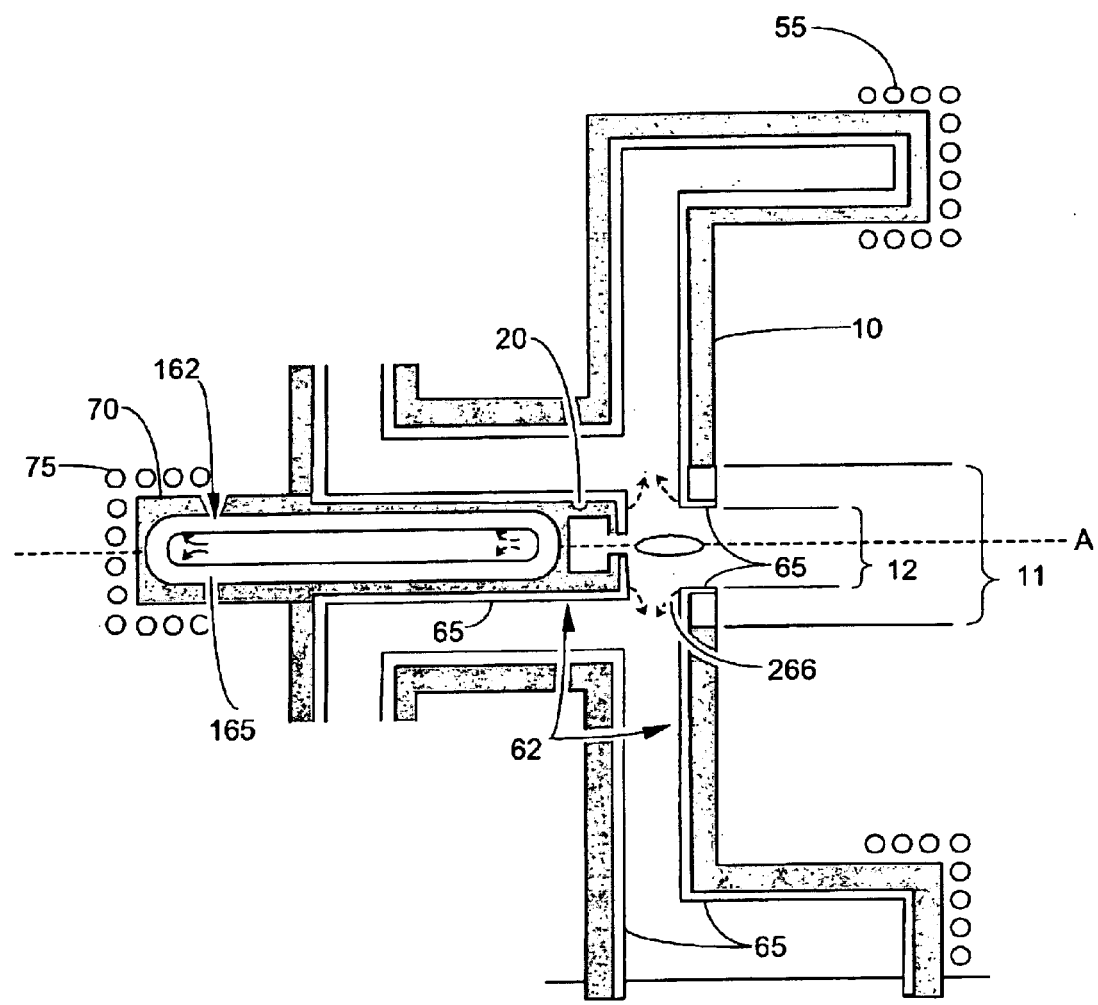

A radiation source unit according to an embodiment of the invention is depicted in FIGS. 2A and 2B. A radiation source LA comprises a number of substantially concentric structures, arranged about a central axis A. A substantially cylindrical cathode 20, surrounded by a substantially cylindrical anode 10, is separated from said anode 10 by an annular isolator 30. The hollow-cathode 20 is provided with a cavity 22 and an aperture 26, such that the source LA operates in a similar way to the example depicted in FIGS. 7A to 7E and described herein.

Plasma discharge occurs mainly in a discharge space, approximately disposed between cathode 20 and an anode aperture 11 in a central region surrounding the site of plasma pinch formation 45. In the embodiment shown, lithium is used to create the plasma for operating the source LA, and lithium plasma can be found in a plasma region that substantially comprises the whole internal volume of the radiation source LA.

The anode 10 and cathode 20 are configured and arranged such that the isolator 30 is disposed at some distance from the plasma region. This distance, combined with an isolator protection cooling element 50 that condenses lithium vapor, prevents contact between the lithium and the isolator 30 and thus prevents possible corrosion of the isolator 30.

According to an embodiment, the source LA differs from a typical plasma discharge source in that the plasma region is extended by elongating the walls of the anode 10 away from the discharge region. This elongated extension space creates an anode 10 with a hollow structure resembling one half of a thick-rimmed Petri dish, with an anode aperture 11 at the center of the "dish", and an anode cooling element 55 along the rim of the "dish".

Lithium is found in different forms at different locations within the source LA:

liquid lithium 62 in a reservoir 60 comprising a heating element 64 to keep the lithium liquefied;

lithium gas, vapor and or plasma throughout the plasma region; and liquid lithium 62 in a wicking surface (wick) 65 (as shown in FIG. 2B). Parts of the walls of the cathode 20 and anode 10 are equipped with wick 65, which is saturated (wetted) with liquid lithium 62 during operation of the source LA. To prevent lithium droplet formation, the surface structure of the wick 65 has a roughness Ra of less than 100 micron.

As shown in FIG. 2A, the radiation source unit comprises cooling elements, which may be, for instance, cooling lines or any other suitable means:

a hollow trap cooler 92 for cooling the hollow trap 90, configured and arranged to create a cooling surface inside the hollow trap 90;

the anode cooler 55 for cooling the anode 10, configured and arranged to create a cooling surface at the end of the elongated extension space furthest from the discharge space;

a cathode cooler 75 for cooling one end of the closed heat pipe 70, configured and arranged to cool the tip of the cathode 20 closest to the discharge space. The closed heat pipe 70, similar to the example depicted in FIG. 6 and described herein, employs a wicking surface (wick) 165, saturated with a liquid 162, to transfer heat from the tip of the cathode 20 to a region proximate the cathode cooler 75. The wick 165 and liquid 162 in the closed heat pipe 70 may or may not be the same as the wick 65 and liquid 62; and the isolator protection cooler 50, configured and arranged to create a cooling surface on the walls of the cathode 20 and anode 10, and thus to condense any vapor before it can reach the isolator 30.

Figure 5A:
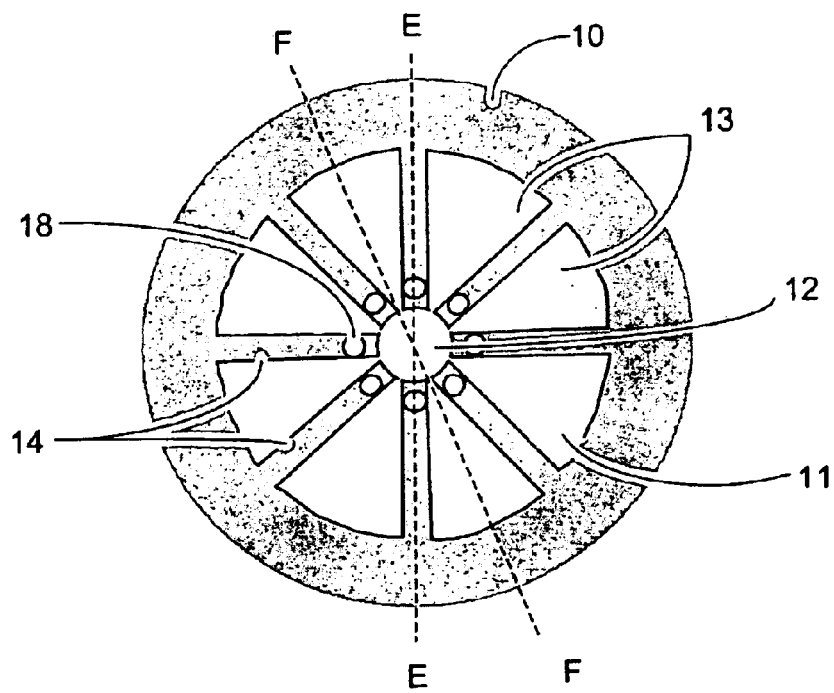
FIGS. 5A to 5C depict an anode according to yet another embodiment of the invention, where
Figure 5B:
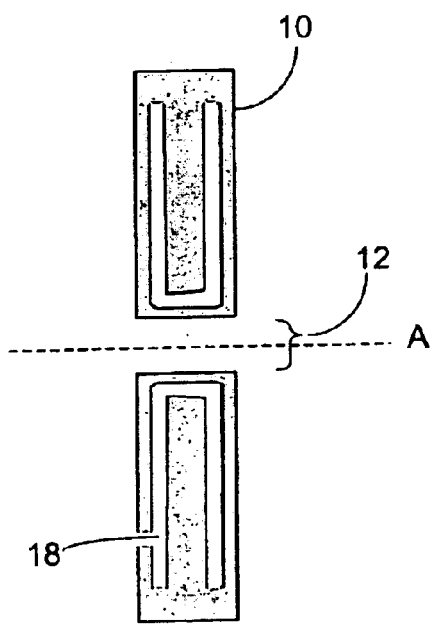
Figure 5C:
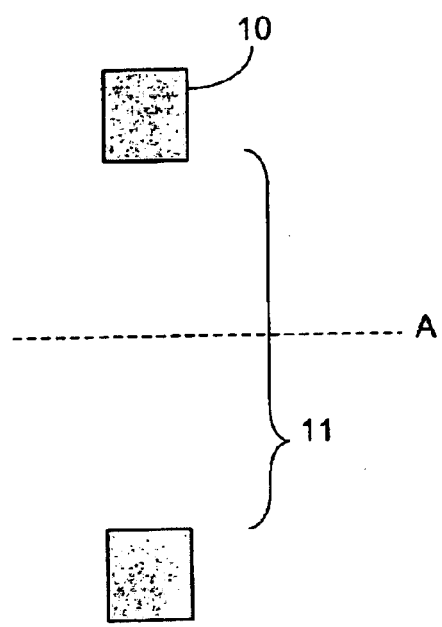
Figures 7A, 7B, 7C, 7D, 7E:
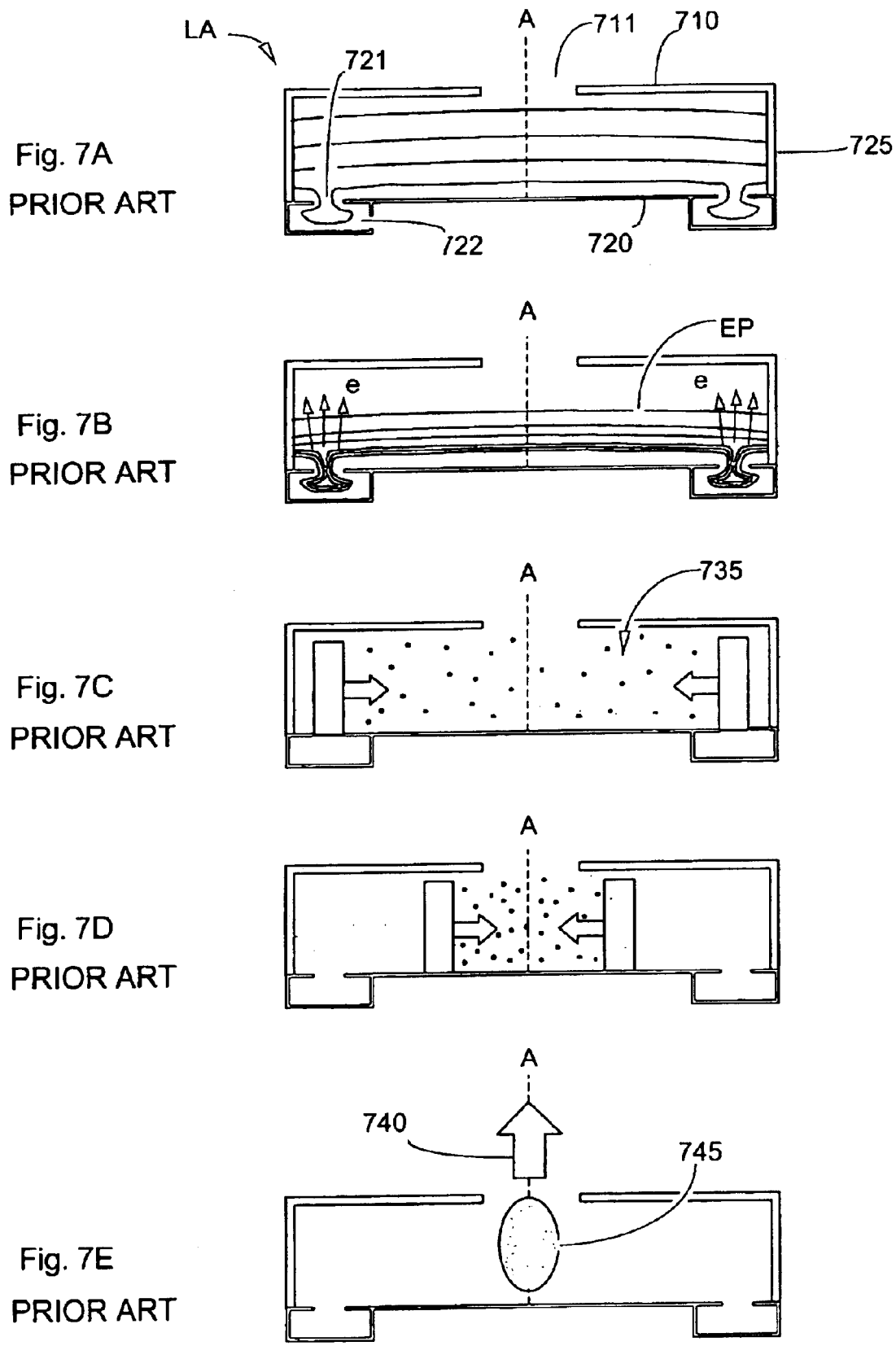
FIGS. 7A to 7E depict a discharge of the hollow-cathode type at various stages of discharge.

As depicted in FIG. 2B and FIGS. 5A to 5C, the anode 10 is provided with two substantially symmetrical apertures, an emission aperture 11 through which emitted radiation is passed, and a smaller diameter electrical aperture 12 used to control the position of the plasma pinch. FIG. 5A shows a plan view of the anode aperture 11 as viewed by the cathode 20, and FIGS. 5B and 5C show cross sections E—E and F—F respectively through the plan view. The anode 10 is provided with a plurality of protrusions 14 that create the electrical aperture 12, which is smaller in diameter than the emission aperture 11, and where each protrusion 14 is provided with a cooling channel 18. Radiation 40 will leave the discharge space through the emission aperture 11, which comprises the electrical aperture 12 and the gaps 13 between the protrusions 14.

Figure 3A:
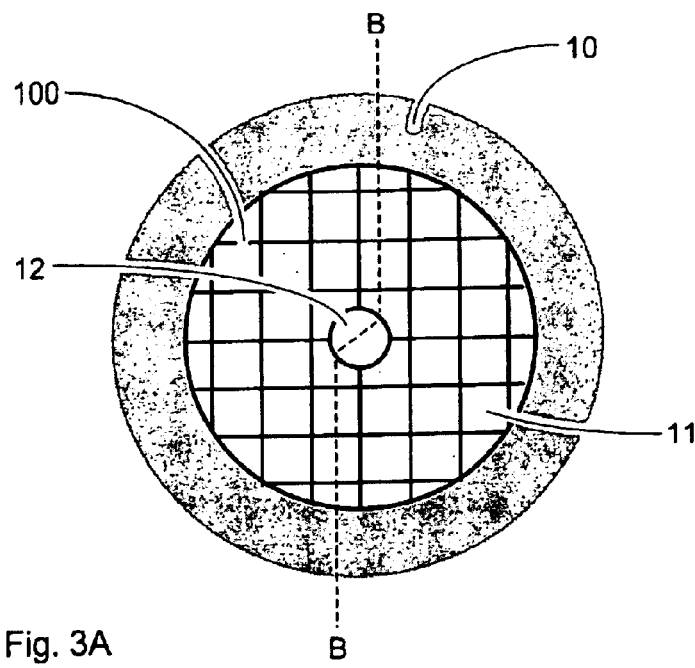
FIGS. 3A to 3C depict an anode according to an embodiment of the invention, where
Figure 3B:
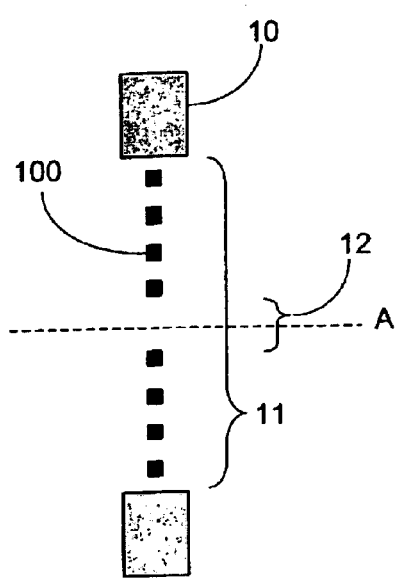
Figure 3C:
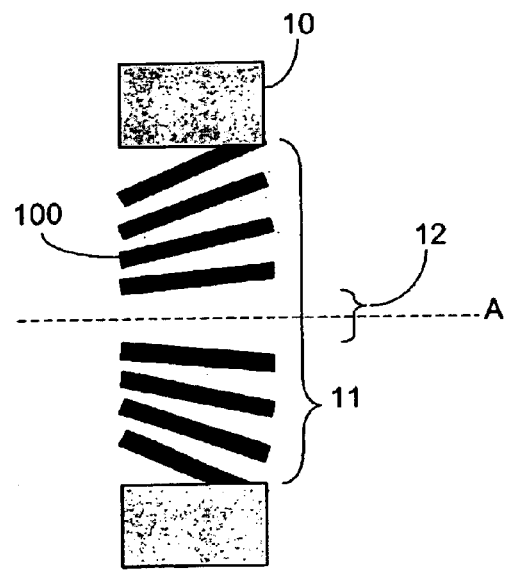
Figure 4A:
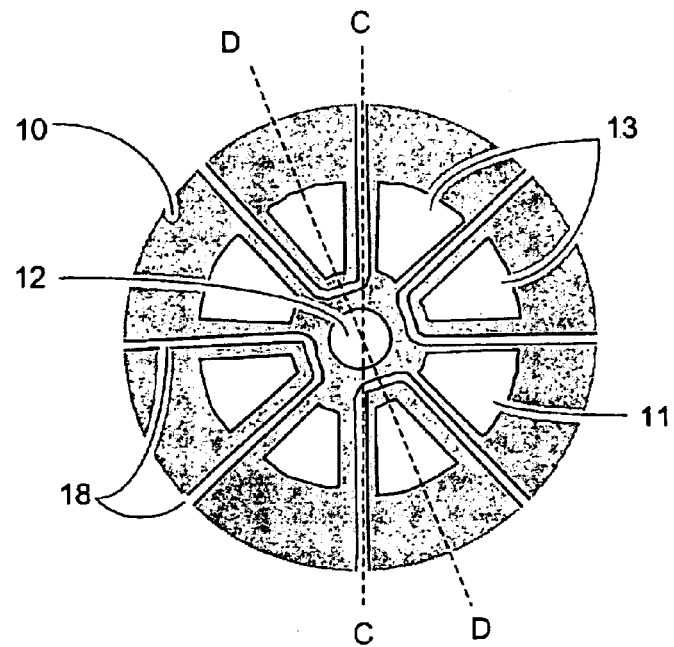
FIGS. 4A to 4C depict an anode according to another embodiment of the invention, where
Figures 4B, 4C:
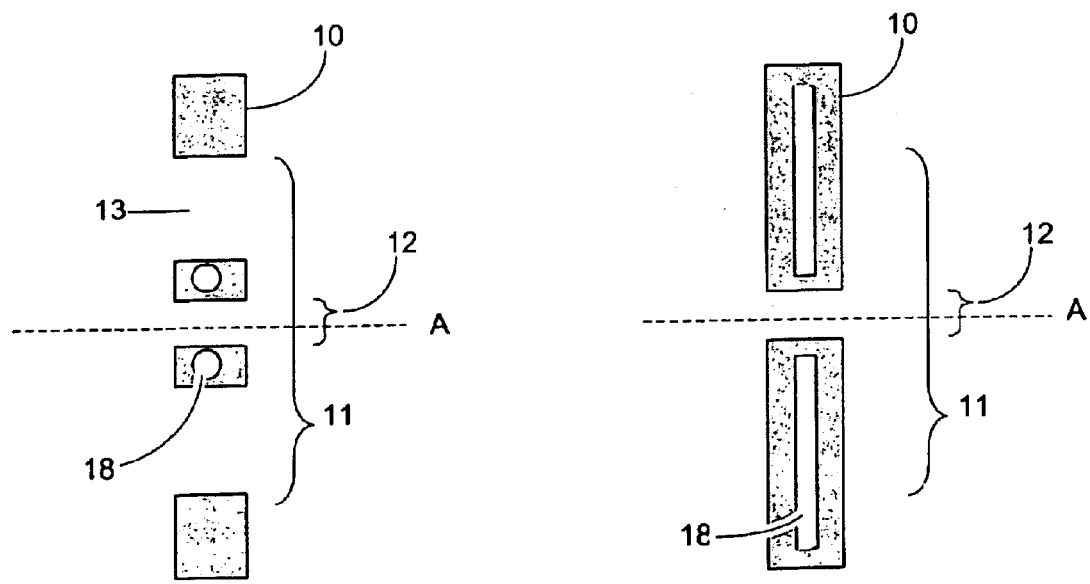

FIGS. 5A to 5C depict eight protrusions 14, but it will be appreciated that any suitable number, size and shape are possible. In addition, there are many more possibilities to create an electrical aperture that is smaller in diameter than the emission aperture, for instance:

FIGS. 3A to 3B show how a conductive grid 100 of wires maybe employed. FIG. 3A shows a plan view of an emission aperture 11 as viewed by a cathode, and FIG. 3B shows the cross-section B—B through the plan view. The design may be further optimized by employing hollow wires and passing a cooling medium through them, changing the number, size and shape of the wires, employing a concentric/radial grid pattern, employing a grid of parallel wires intersecting at a non-perpendicular angle with a second set of parallel wires or some combination of these measures;

FIG. 3C shows an alternative cross-section B—B of the plan view in which the grid wires are extended, and rotated away from the central axis A, such that the grid 100 forms a so-called "foil trap" or contaminant filter. As disclosed in United States patent U.S. Pat. No. 6,359,969, the "foil trap" enhances the ability of a radiation source unit to capture contamination, preventing it from entering the lithographic projection apparatus; and FIGS. 4A to 4C show how a larger diameter emission aperture 11 may be created by creating substantially symmetrical gaps 13 in the anode 10 close to an electrical aperture 12. FIG. 4A shows the anode aperture in plan view as viewed by a cathode, FIGS. 4B and 4C show cross-sections C—C and D—D respectively of the plan view. Cooling is provided using cooling channels 18 in the anode 10, through which any suitable cooling medium may be passed. Although only eight gaps are depicted, it will be appreciated that any suitable number, size and shape may be employed.

Figure 8:
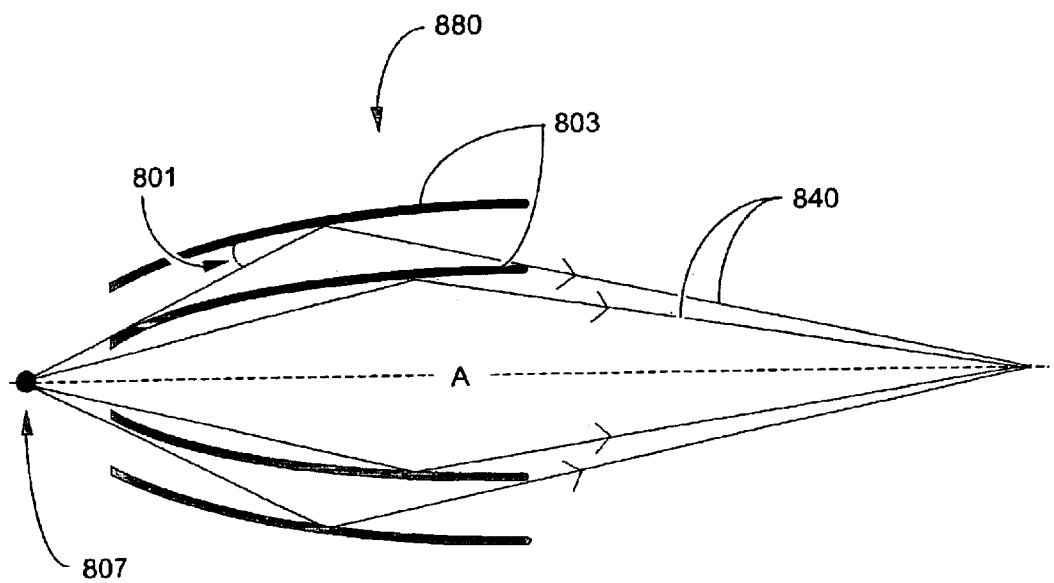
FIG. 8 depicts the basic elements and operation of a grazing-incidence collector.

As shown in FIG. 2A, electromagnetic radiation 40 from the discharge space is emitted through the emission aperture 11 along a central axis A, and directed to a lithographic projection apparatus along an optical axis of the source LA using a grazing-incidence collector 80. In the embodiment shown, the optical axes of both the source LA and the collector 80 coincide with the central axis A. Although only one collector shell is shown, the grazing incidence collector 80 typically comprises several concentric shells similar in construction and operation to the example depicted in FIG. 8 and described herein.

A hollow trap 90 comprises a substantially cylindrical receptacle, with one end open and one end closed, disposed substantially symmetrical about the optical axis in the central region of the grazing-incidence collector 80. The inner surface of the trap 90 is rough and porous to maximize the capture surface area, and cooled using the hollow trap cooler 92 to enhance capture.

A discharge power supply (not shown) is connected to anode 10 and cathode 20 to provide for a pulsed voltage V across the anode-voltage gap inside the radiation source LA.

The radiation source LA (as depicted in FIGS. 2A to 2B) is brought into a state where it is about to form a discharge plasma and a subsequent plasma pinch using a steady state filling of the plasma region with lithium vapor. This steady-state vapor flow is created using heating element 64 in the reservoir 60 to create liquid lithium 62 at a temperature close to its boiling point. Three mechanisms determine the pressure and flow of lithium vapor inside the source:

vapor formation over the whole surface of the wick 65. Driven by capillary driving force, the liquid lithium 62 flows through the wick 65 such that it is continuously present on the surfaces of the anode 10 and the cathode 20;

vapor formation 66 due to the heating of the liquid lithium 62 in the reservoir 60 by the heating element 64; and vapor condensation 67 by the coolers 50 and 55.

If the concentration of lithium vapor is sufficient, the cycling of the discharge power supply (not shown) triggers the discharge and the formation of a plasma pinch 45, resulting in a pulse of radiation 40 out of the emission aperture 11. The radiation 40 is directed via the grazing-incidence collector 80 into the lithographic projection apparatus. As shown in FIG. 2B, additional lithium vapor 266 forms in the discharge space due the increased evaporation of liquid lithium in the wick 65 by the heat of the discharge.

As shown in FIG. 2A, lithium vapor condenses 67 at a distance from the discharge space using the anode cooler 55 and the isolator protection cooler 50. This liquid is drawn either into the wick 65, or it will flow down into the reservoir 60.

The position and timing of the pinch are influenced by the dimensions of the electrical aperture 12. It is calculated that variation in the position of the pinch 45 is approximately $\frac{1}{10}$ the diameter of the electrical aperture 12 (as depicted in FIG. 2B), hence the improvement in pinch stability by reducing the electrical aperture 12 without changing the emission aperture 11.

Figure 6:
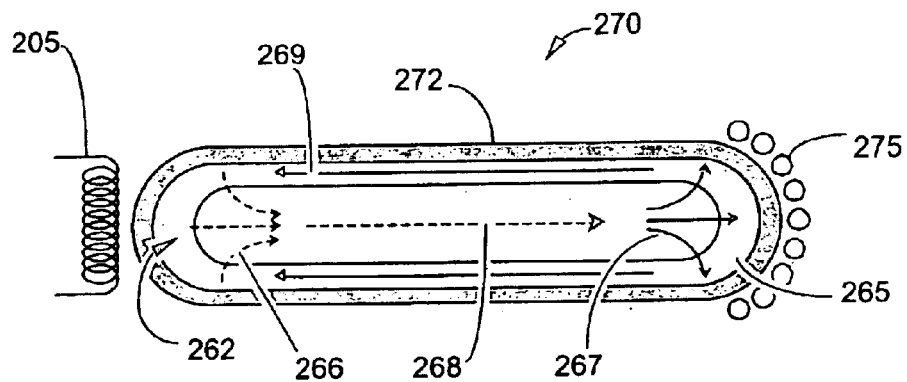
FIG. 6 depicts the basic elements and operation of a closed heat pipe.

The discharge space is cooled by a number of different mechanisms:

the radiation source LA (FIG. 2B) employs a closed heat pipe 70, which is substantially identical to the example depicted in FIG. 6 and described herein, to transfer heat away from the cathode 20 to the periphery of the system;

the radiation source LA (FIG. 2A) also comprises a heat pipe configuration that is not sealed (open heat pipe), comprising the anode 10, the cathode 20, the wick 65, liquid lithium in the wick and the anode cooler 55. As liquid lithium vaporizes 266 by the heat of the discharge, the movement of the vapor transfers heat away from the discharge space to the periphery of the system in a similar way to the example depicted in FIG. 6 and described herein;

propagation of a plasma wave inside the open heat pipe structure provides a further channel for heat transfer to the periphery. This method of heat transfer is called the Plasma Heat Transfer Mechanism (PHTM); and as depicted in FIGS. 5A to 5C, the tips of the protrusions 14 closest to the discharge space are cooled by passing a suitable medium through the cooling channels 18.

Evaporation of liquid lithium 266 from the wick 65 (FIGS. 2A to 2B) provides not only a means of dissipating heat, but it also protects the electrodes, the anode 10 and the cathode 20, from erosion. Mass limited evaporation of lithium from the electrode surface induces a thin lithium film over the electrodes, reducing contamination 95 which may pass from the source LA to the optics of the lithographic projection apparatus.

Although minimized by an embodiment of the invention, source operation may cause a flow of contamination 95 from the discharge space. The contamination, for instance, lithium vapor, lithium plasma or eroded materials from the electrode surfaces, can damage any optical element further downstream of the EUV source. According to an embodiment of the invention, a large proportion of the contamination 95 enters the hollow trap 90, where it is trapped using a combination of geometry (cylindrical shape), surface area inside the trap (roughness and porosity) and cooling 92. Although the trap is shown as a cylinder with one end open, any suitable geometry may be used, for instance, a sphere, cone, or parabola, so long as it does not interfere with the emitted radiation 40 passing over the surface of the grazing-incidence collector 80. Typically, the hollow trap 90 will have a substantially similar shape to the central shell of the grazing-incidence collector 80.

Alternatively, disposing an electron-beam generator so that the electron beam heats a region close to the discharge space may provide a better control of the lithium vapor, and thus of the discharge conditions. Using the heating element 64 in the reservoir 60, lithium 62 is kept in its liquid form at a temperature close to the melting point. At regular intervals, an electron beam is fired at an area containing liquid lithium 62 close to the discharge space, creating lithium vapor. This has the advantage that the source can be operated using a minimum amount of vapor and/or low temperature plasma in the discharge space, thus minimizing the absorption of emitted EUV radiation. This effectively improves the conversion efficiency of the source. Erosion of the electrodes due to the electron-beam is greatly reduced due to the layer of liquid lithium protecting it. Alternatively, a second conventional heating element close to the discharge space may be used instead of the electron-beam heater.

It may be advantageous to create the lithium vapor by evaporating (exploding) with an electron beam a liquid droplet or solid wire (<~100 micron) of lithium placed between anode 10 and cathode 20 close to the discharge space, thus preventing entirely erosion of the electrodes.

For either use described, the electron-beam may be substituted by another radiation or particle beam, for instance a laser beam, which allows vapor concentration to be varied using the laser parameters, such as wavelength, energy per impulse and pulse length. For instance, a Nd-YAG laser employed to vaporize lithium from the surface of the anode 10 or cathode 20 may operate with parameters: wavelength 1.04 micron, energy per impulse 10–100 mJ, and pulse length 1–100 ns.

The skilled artisan will appreciate that although the description refers solely to the use of lithium, the source LA may be operated with any suitable substance, for instance xenon, indium, iridium, tin or a combination of these. In addition a combination of suitable substances may be used, for instance one substance for the cooling within the open heat pipe construction, and a different substance to create the discharge.

Any of the aspects of the invention and its embodiments may be used with any type of radiation source that relies on discharge, such as Z-pinch, capillary discharge, or plasma focus devices. It may be particularly advantageous to employ these aspects in the radiation source described in European Application No. 02256486.8 (corresponding to U.S. patent application Ser. No. N/A to Koshelev et al., titled "Radiation Source, Lithographic Apparatus and Device Manufacturing Method", filed Sep. 17, 2003—attorney ref. 081468/0306001), incorporated herein in its entirety by reference, which already has improved cooling, an increased pulse timing stability and an increased conversion efficiency.

Accordingly, the scope of the invention should be determined not by the embodiment(s) illustrated, but by the appended claims and their equivalents.

What is claimed is:

1. A radiation source comprising an anode and a cathode that are configured and arranged to create a discharge in a substance in a discharge space between said anode and cathode and to form a plasma so as to generate electromagnetic radiation, wherein a wicking surface area of a wall defining said discharge space is configured to transport a liquid towards said discharge space from a liquid reservoir in contact with said wicking surface area.

2. A radiation source according to claim 1, wherein said wicking surface area is provided on at least one of said anode and said cathode.

3. A radiation source according to claim 1, wherein a cooling surface area of a wall defining said discharge space is provided with cooling to condense vaporized liquid from said discharge space to transfer heat from said discharge space to said cooling surface.

4. A radiation source according to claim 1, wherein a material comprised in said liquid is used in creating said plasma.

5. A radiation source according to claim 1, wherein said discharge space is provided with an elongated extension space, a cooling surface area provided on a wall of said extension space at a distance from a central region of said radiation source.

6. A radiation source according to claim 1, wherein said radiation source comprises an energetic beam to irradiate said wicking surface area proximate said discharge space.

7. A radiation source according to claim 6, wherein said energetic beam is a beam of charged particles.

8. A radiation source according to claim 6, wherein said energetic beam is a laser beam.

9. A radiation source according to claim 1, wherein said liquid comprises an element selected from the group consisting of: xenon (Xe), tin (Sn), lithium (Li), indium (In) and iridium (Ir).

10. A radiation source according to claim 1, further comprising a hollow receptacle arranged on an optical axis of said radiation source, an open end of said receptacle directed to said discharge space to capture contamination emitted from said discharge space.

11. A radiation source according to claim 10, wherein said receptacle is configured to be cooled to enhance trapping of contamination on inside walls of said receptacle.

12. A radiation source according to claim 1, further comprising an aperture provided in said anode or said cathode through which said electromagnetic radiation is emitted, said aperture comprising a plurality of electrically-conductive structures arranged so as to leave said aperture substantially open to said radiation but to substantially close said aperture electrically.

13. A radiation source according to claim 12, wherein said structures are configured to be cooled.

14. A radiation source according to claim 1, comprising at least one closed heat pipe.

15. A lithographic projection apparatus comprising:
a radiation system comprising an anode and a cathode that are configured and arranged to create a discharge in a substance in a discharge space between said anode and cathode and to form a plasma so as to generate a projection beam of radiation, wherein a wicking surface area of a wall defining said discharge space is configured to transport a liquid towards said discharge space from a liquid reservoir in contact with said wicking surface area;

a support structure configured to hold a patterning device, the patterning device configured to pattern the projection beam according to a desired pattern;

a substrate table configured to hold a substrate; and a projection system configured to project the patterned beam onto a target portion of the substrate.

16. A lithographic apparatus according to claim 15, wherein said wicking surface area is provided on at least one of said anode and said cathode.

17. A lithographic apparatus according to claim 15, wherein a cooling surface area of a wall defining said discharge space is provided with cooling to condense vaporized liquid from said discharge space to transfer heat from said discharge space to said cooling surface.

18. A radiation source comprising an anode and a cathode that are configured and arranged to create a discharge in a substance in a discharge space between said anode and cathode and to form a plasma so as to generate electromagnetic radiation, wherein a wicking surface area of a wall defining said discharge space is configured to transport a liquid towards said discharge space from a liquid reservoir in contact with said wicking surface area, said anode, said cathode, or both being substantially vertically located above the liquid reservoir.

19. A lithographic projection apparatus, comprising:

a radiation system comprising an anode and a cathode that are configured and arranged to create a discharge in a substance in a discharge space between said anode and cathode and to form a plasma so as to generate a projection beam of radiation, wherein a wicking surface area of a wall defining said discharge space is configured to transport a liquid towards said discharge space from a liquid reservoir in contact with said wicking surface area, said anode, said cathode, or both being substantially vertically located above the liquid reservoir;

a support structure configured to hold a patterning device, the patterning device configured to pattern the projection beam according to a desired pattern;

a substrate table configured to hold a substrate; and a projection system configured to project the patterned beam onto a target portion of the substrate.

20. A lithographic projection apparatus comprising:

a radiation system, comprising:

an anode and a cathode that are configured and arranged to create a discharge in a substance in a discharge space between said anode and cathode and to form a plasma so as to generate a projection beam of radiation, an aperture provided in said anode or said cathode through which said projection beam of radiation is emitted, said aperture comprising a plurality of electrically-conductive structures arranged so as to leave said aperture substantially open to said projection beam of radiation but to substantially close said aperture electrically, and a wicking surface area of a wall defining said discharge space configured to transport a liquid towards said discharge space from a liquid reservoir in contact with said wicking surface area;

a support structure configured to hold a patterning device, the patterning device configured to pattern the projection beam according to a desired pattern;

a substrate table configured to hold a substrate; and a projection system configured to project the patterned beam onto a target portion of the substrate.

21. A lithographic projection apparatus, comprising:

a radiation system, comprising:

a radiation source comprising an anode and a cathode that are configured and arranged to create a discharge in a substance in a discharge space between said anode and cathode and to form a plasma so as to generate a projection beam of radiation and a wicking surface area of a wall defining said discharge space configured to transport a liquid towards said discharge space from a liquid reservoir in contact with said wicking surface area, and a hollow receptacle arranged on an optical axis of the radiation source, an open end of the receptacle directed to the radiation source to capture contamination emitted from the radiation source;

a support structure configured to hold a patterning device, the patterning device configured to pattern the projection beam according to a desired pattern;

a substrate table configured to hold a substrate; and a projection system configured to project the patterned beam onto a target portion of the substrate.

22. A radiation source, comprising:

an anode and a cathode that are configured and arranged to create a discharge in a substance in a discharge space between said anode and cathode and to form a plasma so as to generate electromagnetic radiation;

a wicking surface area of a wall defining said discharge space that is configured to transport a liquid towards said discharge space from a liquid reservoir in contact with said wicking surface area; and an elongated extension space of the discharge space, a cooling surface area of a wall defining said extension space configured to be cooled by a cooler to condense vaporized liquid from said discharge space and provided at a distance from a central region of said radiation source.

23. A lithographic projection apparatus comprising:

a radiation system, comprising:

an anode and a cathode that are configured and arranged to create a discharge in a substance in a discharge space between said anode and cathode and to form a plasma so as to generate a projection beam of radiation, a wicking surface area of a wall defining said discharge space that is configured to transport a liquid towards said discharge space from a liquid reservoir in contact with said wicking surface area, and an elongated extension space of the discharge space, a cooling surface area of a wall defining said extension space configured to be cooled by a cooler to condense vaporized liquid from said discharge space and provided at a distance from a central region of said radiation system;

a support structure configured to hold a patterning device, the patterning device configured to pattern the projection beam according to a desired pattern;

a substrate table configured to hold a substrate; and a projection system configured to project the patterned beam onto a target portion of the substrate.

24. A radiation source, comprising:

an anode and a cathode that are configured and arranged to create a discharge in a substance in a discharge space between said anode and cathode and to form a plasma so as to generate electromagnetic radiation;

a wicking surface area of a wall defining said discharge space that is configured to transport a liquid towards said discharge space from a liquid reservoir in contact with said wicking surface area;

an isolator configured to electrically separate the anode and cathode; and a cooler located near the isolator and configured to condense vapor to reduce contact of the vapor onto the isolator.

25. A radiation source, comprising:

an anode and a cathode that are configured and arranged to create a discharge in a substance in a discharge space between said anode and cathode and to form a plasma so as to generate electromagnetic radiation, said cathode and said anode being substantially concentric and said anode being disposed at least in part around and outside the cathode; and a wicking surface area of a wall defining said discharge space that is configured to transport a liquid towards said discharge space from a liquid reservoir in contact with said wicking surface area.

* * * * *